US008654603B2

(12) United States Patent
Tak et al.

(10) Patent No.: US 8,654,603 B2
(45) Date of Patent: Feb. 18, 2014

(54) TEST OPERATION FOR A LOW-POWER DOUBLE-DATA-RATE (LPDDR) NONVOLATILE MEMORY DEVICE

(75) Inventors: Jung Mi Tak, Seoul (KR); Ji Hyae Bae, Icheon-si (KR)

(73) Assignee: SK Hynix Inc., Icheon (KR)

( * ) Notice: Subject to any disclaimer, the term of this patent is extended or adjusted under 35 U.S.C. 154(b) by 47 days.

(21) Appl. No.: 13/467,954

(22) Filed: May 9, 2012

(65) Prior Publication Data

US 2012/0287728 A1 Nov. 15, 2012

(30) Foreign Application Priority Data

May 11, 2011 (KR) .................. 10-2011-0044213

(51) Int. Cl.
*G11C 29/04* (2006.01)
(52) U.S. Cl.
USPC .............. 365/233.13; 365/201; 365/185.29; 365/189.03; 365/189.05; 365/189.08; 365/230.06; 365/230.02; 365/230.08; 365/233.18; 365/233.1; 365/236; 714/718
(58) Field of Classification Search
USPC .......... 365/200, 201, 185.09, 185.23, 185.29, 365/189.03, 189.05, 189.08, 230.06, 365/230.02, 230.08, 233.13, 233.18, 233.1, 365/236; 714/718
See application file for complete search history.

(56) References Cited

U.S. PATENT DOCUMENTS

| 5,757,705 | A | * | 5/1998 | Manning ................. 365/189.14 |
| 6,178,532 | B1 | | 1/2001 | Pierce et al. |
| 6,345,013 | B1 | * | 2/2002 | Ingalls et al. ............ 365/230.08 |
| 7,457,179 | B2 | | 11/2008 | Cheon |
| 7,741,862 | B2 | * | 6/2010 | Mochida ................... 324/750.3 |
| 2010/0277994 | A1 | | 11/2010 | Bae |

FOREIGN PATENT DOCUMENTS

| KR | 10-2001-0071455 A | 7/2001 |
| KR | 10-0732241 B1 | 6/2007 |
| KR | 10-2009-0108177 A | 10/2009 |
| KR | 10-2010-0119424 A | 11/2010 |

* cited by examiner

*Primary Examiner* — Andrew Q Tran

(57) ABSTRACT

A nonvolatile memory device is provided relating to a test operation for a Low Power Double-Data-Rate (LPDDR) nonvolatile memory device. The nonvolatile memory device comprises a command decoder configured to decode a test mode signal in a test mode to output program and erasure signals into a memory, an address decoder configured to decode a command address inputted through an address pin in the test mode to output a cell array address into the memory, and an overlay window configured to store a data inputted through a data pin in the test mode.

37 Claims, 12 Drawing Sheets

|  | 12 | 11 | 10 | 9 | 8 | 7 | 6 | 5 | 4 | 3 | 2 | 1 | 0 |
|---|---|---|---|---|---|---|---|---|---|---|---|---|---|
| Buffer Address [1:0] |  |  |  |  |  |  |  |  |  |  |  | a1 | a0 |
| Partition Address [3:0] |  |  |  |  |  |  |  |  |  | b3 | b2 | b1 | b0 |
| X Address [12:0] | c12 | c11 | c10 | c9 | c8 | c7 | c6 | c5 | c4 | c3 | c2 | c1 | c0 |
| Y Address [7:1] |  |  |  |  |  | d7 | d6 | d5 | d4 | d3 | d2 | d1 |  |

Fig.1
<Prior Art>

| Command | | CA PIN | | | | | | | | | |
|---|---|---|---|---|---|---|---|---|---|---|---|
| | | 0 | 1 | 2 | 3 | 4 | 5 | 6 | 7 | 8 | 9 |
| Pre-Active | R | H | H | L | H | 0 | 0 | 0 | a0 | a1 | 0 |
| | F | c11 | c12 | b0 | b1 | b2 | b3 | 0 | 0 | 0 | 0 |
| Active | R | L | H | c6 | c7 | c8 | c9 | c10 | a0 | a1 | 0 |
| | F | d4 | d5 | d6 | d7 | c0 | c1 | c2 | c3 | c4 | c5 |
| Read | R | H | L | H | 0 | 0 | d1 | d2 | a0 | a1 | 0 |
| | F | 0 | d3 | 0 | 0 | 0 | 0 | 0 | 0 | 0 | 0 |
| Write | R | H | L | L | 0 | 0 | d1 | d2 | a0 | a1 | 0 |
| | F | 0 | d3 | 0 | 0 | 0 | 0 | 0 | 0 | 0 | 0 |

Fig.2
<Prior Art>

| External Address (= Command Address) | 25 | 24 | 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|---|---|---|---|---|---|---|---|
| Command | Pre-active | | | | | | | | | Active | | | | | | | | | | | | Read/Write | | | | |
| Logical Address | Partition Address [3:0] | | | | | X Address [12:0] | | | | | | | | | | | | | Y Address [7:1] | | | | | | | |
| Command Address의 DQ mapping | DQ9_F | DQ8_F | DQ7_F | DQ6_F | DQ5_F | DQ4_F | DQ3_F | DQ2_F | DQ1_F | DQ0_F | DQ15_R | DQ14_R | DQ13_R | DQ12_R | DQ11_R | DQ10_R | DQ9_R | DQ8_R | DQ7_R | DQ6_R | DQ5_R | DQ4_R | DQ3_R | DQ2_R | DQ1_R | DQ0_R |

Fig. 3
<Prior Art>

| SDRAM Command | NVM Command | SDR Command Pins ||| DDR CA pins(10) |||||||||| CK_t EDGE |
|---|---|---|---|---|---|---|---|---|---|---|---|---|---|---|
| | | CKE || CS_N | CA0 | CA1 | CA2 | CA3 | CA4 | CA5 | CA6 | CA7 | CA8 | CA9 | |
| | | CK_t(n-1) | CK_t(n) | | | | | | | | | | | | |
| Active (bank) | Active (row buffer) | H | H | L | L | H | R8/a15 | R9/a16 | R10/a17 | R11/a18 | R12/a19 | BA0 | BA1 | BA2 | ↧ |
| | | | | X | R0/a5 | R1/a6 | R2/a7 | R3/a8 | R4/a9 | R5/a10 | R6/a11 | R7/a12 | R13/a13 | R14/a14 | ↥ |
| Write (bank) | Write (RDB) | H | H | L | H | L | L | RFU | RFU | C1 | C2 | BA0 | BA1 | BA2 | ↧ |
| | | | | X | AP³,⁴ | C3 | C4 | C5 | C6 | C7 | C8 | C9 | C10 | C11 | ↥ |
| Read (bank) | Read (RDB) | H | H | L | H | L | H | RFU | RFU | C1 | C2 | BA0 | BA1 | BA2 | ↧ |
| | | | | X | AP³,⁴ | C3 | C4 | C5 | C6 | C7 | C8 | C9 | C10 | C11 | ↥ |
| Precharge (pre bank, all bank) | Precharge (RAB) | H | H | L | H | H | L | H | AB/a30 | X/a31 | X/a32 | BA0 | BA1 | BA2 | ↧ |
| | | | | X | X/a20 | X/a21 | X/a22 | X/a23 | X/a24 | X/a25 | X/a26 | X/a27 | X/a28 | X/a29 | ↥ |

Fig.4
<Prior Art>

TEST OPERATION FOR A LOW-POWER DOUBLE-DATA-RATE (LPDDR) NONVOLATILE MEMORY DEVICE

CROSS-REFERENCE TO RELATED APPLICATION

The priority of Korean patent application No. 10-2011-0044213 filed on May 11, 2011 the disclosure of which is hereby incorporated in its entirety by reference, is claimed.

BACKGROUND OF THE INVENTION

The present invention relates generally to a nonvolatile memory device and more specifically, to a technology of a test operation of a low power double-data-rate (LPDDR) nonvolatile memory device.

Generally, a memory device may be classified as a volatile memory device or a nonvolatile memory device. A nonvolatile memory device uses a nonvolatile memory cell and can preserve stored data even if a power source is off. The nonvolatile memory device includes a flash random access memory (RAM) and a phase change RAM (PCRAM).

A phase change memory device includes memory cells using a phase change material, for example, germanium antimony tellurium (GST), and is configured to store data in the memory cells by applying heat to the GST so that the GST has a crystal or amorphous status.

The nonvolatile memory device, such as a magnetic memory device and a phase change memory (PCM) device, has a data processing speed similar to that of a volatile RAM device.

Among nonvolatile memory devices, an LPDDR nonvolatile memory device is configured to perform an embedded operation such as a program operation or an erasure operation using an overlay window, as defined by Joint Electron Device Engineering Council (JEDEC). The overlay window includes a kind of software for supporting various nonvolatile memory devices to have the same LPDDRx interface and a circuit for supporting the software.

To perform the embedded operation in the LPDDR nonvolatile memory device, the overlay window must transmit a command signal, an address, and data through data (DQ) pins. However, when a non-embedded operation such as an active operation is performed, the command signal and the address are transmitted through address (CA) pins.

FIG. 1 illustrates a map of addresses in pre-active, active, read, and write operations in a conventional LPDDR nonvolatile memory device.

Referring to FIG. 1, a buffer address [1:0] is defined as two addresses of a0 and a1, and a partition address [3:0] is defined as four addresses of b0~b3. A row (X) address [12:0] is defined as thirteen addresses of c0~12, and a column (Y) address [7:1] is defined as seven addresses of d1~d7.

FIG. 2 illustrates an allocation table of CA pins depending on pre-active, active, read, and write commands in the conventional LPDDR nonvolatile memory device.

Referring to FIG. 2, command signals having a logic 'high' or 'low' state and the addresses defined in FIG. 1 are applied through the CA pins to the conventional LPDDR nonvolatile memory device.

FIG. 3 illustrates a mapping relationship of external addresses, logical addresses, and DQ pins in the conventional LPDDR nonvolatile memory device.

Referring to FIG. 3, 26 addresses are allocated to the external addresses, that is, command addresses. Among these addresses, the external addresses [4:2] represent a read/write operation command, the external addresses [19:5] represent an active command, and the external addresses [25:20] represent a pre-active command.

The external addresses [8:2] are defined as column (Y) addresses of the logical addresses, the external addresses [21:9] are defined as row (X) addresses of the logical addresses, and the external addresses [25:22] are defined as partition addresses of the logical addresses.

The external addresses [15:0] are defined as 16 DQ pins DQ0_R~DQ15_R, and the external addresses [25:16] are defined as 10 DQ pins DQ0_F~DQ9_F. Among DDR data, data inputted at a rising edge of a DQ strobe signal are input through the DQ pins DQ0_R~DQ15_R, and data inputted at a falling edge of the DQ strobe signal DQS are input through the DQ pins DQ0_F~DQ9_F.

FIG. 4 illustrates command signals and addresses that are input through DDR CA pins in a double data rate synchronous DRAM device and a nonvolatile memory device. A detailed explanation for FIG. 4 will be omitted because it is described in the specifications of the JEDEC.

FIG. 5 illustrates the problem of data collision that occurs when an address driving unit is coupled with a command driving unit in a device supporting the specifications of an LPDDR2 nonvolatile memory device with analysis equipment.

In general, in a DDR2 device, an address is input in synchronization with a rising edge and a falling edge of a clock CLK. Thus, two or less address driving units are coupled to each DQ pin and five or less address driving units are coupled to each CA pin.

An operation of receiving an address is explained using, for example, a CA pin CA1. Referring to FIGS. 1 to 4, an address c12 (a21) is input to the CA pin CA1 when the pre-active command is input, an address d5 (a6) is input to the CA pin CA1 when the active command is input, and an address driving unit corresponding to an address d3 (a4) is coupled to the CA pin CA1 when the read or write command is input.

In an active mode, a signal input on a rising edge line of the CA pin CA1 is a logic 'high' signal corresponding to the command signal. The logic 'high' signal applied to a command driving unit is coupled to a falling edge line of the CA pin CA1 as shown in a path (A). The falling edge line of the CA pin CA1 is coupled through a rising edge line of a DQ pin DQ4 to a falling edge line of the DQ pin DQ4, a falling edge line of the CA pin CA0 and a rising edge line of the CA pin CA0, which results in data collision with a command driving unit of the CA pin CA0. Such data collision occurs because the LPDDR nonvolatile memory device should transmit an address through a data pin as well as an address pin for supporting the embedded operation.

As a result, the usage of the analysis equipment is limited, and test time increases, which increases the costs required to test the LPDDR nonvolatile memory device. For example, if a buffered program is performed through the LPDDR nonvolatile memory, information is transmitted using a command code, an address, a program buffer, a multi-purpose register, and an execute command. In the program operation, a time t0W for writing data in the overlay window and a write time tPGM for programming the data in a cell are required. The time t0W is (tRP+tRCD+tWR)×(4+data count/8), wherein tRP represents a RAS precharge time, tRCD represents a RAS to CAS delay, and tWR represents a write recovery time. In a DDR device that uses eight clocks, the condition for writing the data in the overlay window sets a burst length to '16', tRP to 3×tCK, tRCD to 100 nsec, and tWR to write latency (WL)+BL/2.

That is, in the buffered program operation, all of the above information is required to perform the embedded operation. The information is transmitted into the memory using the write command. As a result, as the information required in the program operation becomes greater, the write operation time becomes longer. Moreover, when the information is dispersed in the overlay window, a pre-active operation and an active operation are required. The number of required pre-active and active operations is 4+data count/8. The data count is determined depending on how many bytes of data are written in the cells, and represents the number of bytes of data transmitted into the program buffer.

The write time of the overlay window corresponds to hundreds of nanoseconds. That is, hundreds of nanoseconds are s required only for setting the program operation. Since the time taken to program the data of 4 bytes in the cells is about hundreds of nanoseconds (e.g., 100 nsec), the write time of the overlay window is a relatively long time.

FIG. 6 illustrates a block diagram of a conventional nonvolatile memory device.

The conventional nonvolatile memory device includes an overlay window 10, a command decoder 20, an address decoder 30, and a global input output bus (WGIO) 40.

The overlay window 10 includes a command code storage region 11 configured to store a command code, a command address storage region 12 configured to store a command address, a command data storage region 13 configured to store command data and a program buffer 14.

The command code stored in the command code storage region 11 is decoded by the command decoder 20 and then transmitted into a memory (not shown). The command address stored in the command address storage region 12 is decoded by the address decoder 30 and then transmitted into the memory.

The command data stored in the command data storage region 13 is transmitted through the global input output bus 40 into the memory. Program information buffered by the program buffer 14 is transmitted through the global input output bus 40 into the memory.

The conventional nonvolatile memory device designates an address of the overlay window 10 using an address input through a CA pin. A DQ pin transmits data applied from the outside into the overlay window 10. The data input through the DQ pin is stored in the command code storage region 11, the command address storage region 12, the command data storage region 13, and the program buffer 14. As a result, a command signal, an array address, and cell data for the memory are determined based on values stored in the overlay window 10. Then, when an execute command is applied, the embedded operation is performed.

The above-described problems result from the usage of the overlay window 10 to transmit a command signal, an address, and a data in a test operation of the LPDDR nonvolatile memory device.

BRIEF SUMMARY OF THE INVENTION

Various embodiments of the present invention are directed to providing a nonvolatile memory device for supporting test equipment without any data collision by transmitting a command signal and an address without using an overlay window in a LPDDR nonvolatile memory device. That is, the address for performing an embedded operation is transmitted into a CA pin in a test mode so as to prevent the collision of command signals in the test equipment. Additionally, the test mode is differentiated depending on the type of embedded operation so that the command signal and the address may be transmitted into a memory without using the overlay window.

According to an embodiment of the present invention, a s nonvolatile memory device comprises: a command decoder configured to decode a test mode signal in a test mode to output program and erasure signals into a memory; an address decoder configured to decode a command address inputted through an address pin in the test mode to output a cell array address into the memory; and an overlay window configured to store a data inputted through a data pin in the test mode.

The program signal includes a single program signal and a buffered program signal.

The overlay window includes: a command data storage unit configured to store a command data received through the data pin in the test mode; and a program buffer configured to buffer the data received through the dtata pin in the test mode.

The command data is stored in the command data storage unit when the test mode signal is a single program test signal.

The data is stored in the program buffer when the test mode signal is a buffered program test signal.

The memory in the test mode determines a command signal and the cell array address in response to signals received from the command decoder and the address decoder in the test mode and a cell data in response to the data stored in the overlay window.

The command decoder includes: a command code decoder configured to decode a command code stored in the overlay window in a normal mode; and a code combination unit configured to combine the test mode signal, a write command and an output of the command code decoder in the test mode.

The code combination unit activates the program signal or the erasure signal when the test mode signal and the write command are activated in the test mode.

The test mode signal includes a single program test signal, a buffered program test signal and an erasure test signal.

The address decoder includes: an address selection unit configured to select the command address or an address stored in the overlay window depending on activation of the test mode signal; and an address output unit configured to latch an output of the address selection unit to output the cell array address when the test mode signal and the write command are activated.

The command address includes a pre-active address, an active address and a write address.

The pre-active address, the active address and the write address are sequentially applied.

The address output unit includes: a logic combination element configured to combine the write command with the test mode signal; and a latch unit configured to latch an output of the address selection unit depending on an output of the logic combination element.

The address decoder includes: an up-counter configured to perform an up counting operation; a data selection unit configured to select a previously set data count value or a data count value stored in the overlay window in response to the test mode signal; and a logic combination element configured to combine an output of the data selection unit with an output of the up-counter to output a count end signal.

The test mode signal includes a buffered program test signal.

The nonvolatile memory device further comprises a global input output bus configured to transmit the data received through the overlay window into the memory.

The overlay window further includes: a command code storage unit configured to store a command code in a normal mode; and a command address storage unit configured to store a command address in the normal mode.

The overlay window outputs the data by fixing the width of the data as 32 bytes when a burst length is 16 when the buffered program is operated.

The nonvolatile memory device further comprises a storage control unit configured to store information received through the data pin in the overlay window.

The storage control unit uses information inputted into the address pin as an address of the overlay window in a normal mode.

The storage control unit stores data inputted into the data pin in the command data storage unit or a program buffer in the test mode.

The storage control unit stores the data in the command data storage unit when the test mode signal is a single program test signal and the data in the program buffer when the test mode signal is a buffered program test signal.

According to another embodiment of the present invention, a nonvolatile memory device comprises: a command decoder configured to decode a test mode signal in a test mode to output program and erasure signals into a memory; an address decoder configured to decode a command address inputted through an address pin in the test mode to output a cell array address into the memory; and a row data buffer configured to store a data inputted through a data pin in the test mode.

The program signal includes a single program signal and a buffered program signal.

The row data buffer includes: a command data storage unit configured to store a command data received through the data pin in the test mode; and a program buffer configured to buffer the data received through the data pin in the test mode.

The command data is stored in the command data storage unit when the test mode signal is a single program test signal.

The data is stored in the program buffer when the test mode signal is a buffered program test signal.

The memory in the test mode determines a command signal and the cell array address in response to signals applied from the command decoder and the address decoder and a cell data in response to the data stored in the row data buffer.

The command decoder includes: a command code decoder configured to decode a command code stored in the overlay window in a normal mode; and a code combination unit configured to combine the test mode signal, a write command and an output of the command code decoder.

The code combination unit activates the program signal or the erasure signal when the test mode signal and the write command are activated in the test mode.

The test mode signal includes a single program test signal, a buffered program test signal and an erasure test signal.

The address decoder includes: an address selection unit configured to select the command address or an address stored in the overlay window depending on activation of the test mode signal; and an address output unit configured to latch an output of the address selection unit to output the cell array address when the test mode signal and the write command are activated.

The command address includes a pre-active address, an active address and a write address.

The pre-active address, the active address and the write address are sequentially applied.

The address output unit includes: a logic combination element configured to combine the write command with the test mode signal; and a latch unit configured to latch an output of the address selection unit depending on an output of the logic combination element.

The address decoder includes: an up-counter configured to perform an up counting operation; a data selection unit configured to select a previously set data count value or a data count value stored in the overlay window in response to the test mode signal; and a logic combination element configured to combine an output of the data selection unit with an output of the up-counter to output a count end signal.

The test mode signal includes a buffered program test signal.

The nonvolatile memory device further comprises a global input output bus configured to transmit the data received through the row data buffer into the memory.

The row data buffer outputs the data by fixing the width of the data as 32 bytes when a burst length is 16 when the buffered program is operated.

BRIEF DESCRIPTION OF THE DRAWINGS

FIGS. 1 to 4 illustrate a mapping relationship of a command signal, an address, and data used in a conventional LPDDR nonvolatile memory device.

DESCRIPTION OF EMBODIMENTS

Exemplary embodiments of the present invention will be described in detail with reference to the attached drawings.

Figure 5:
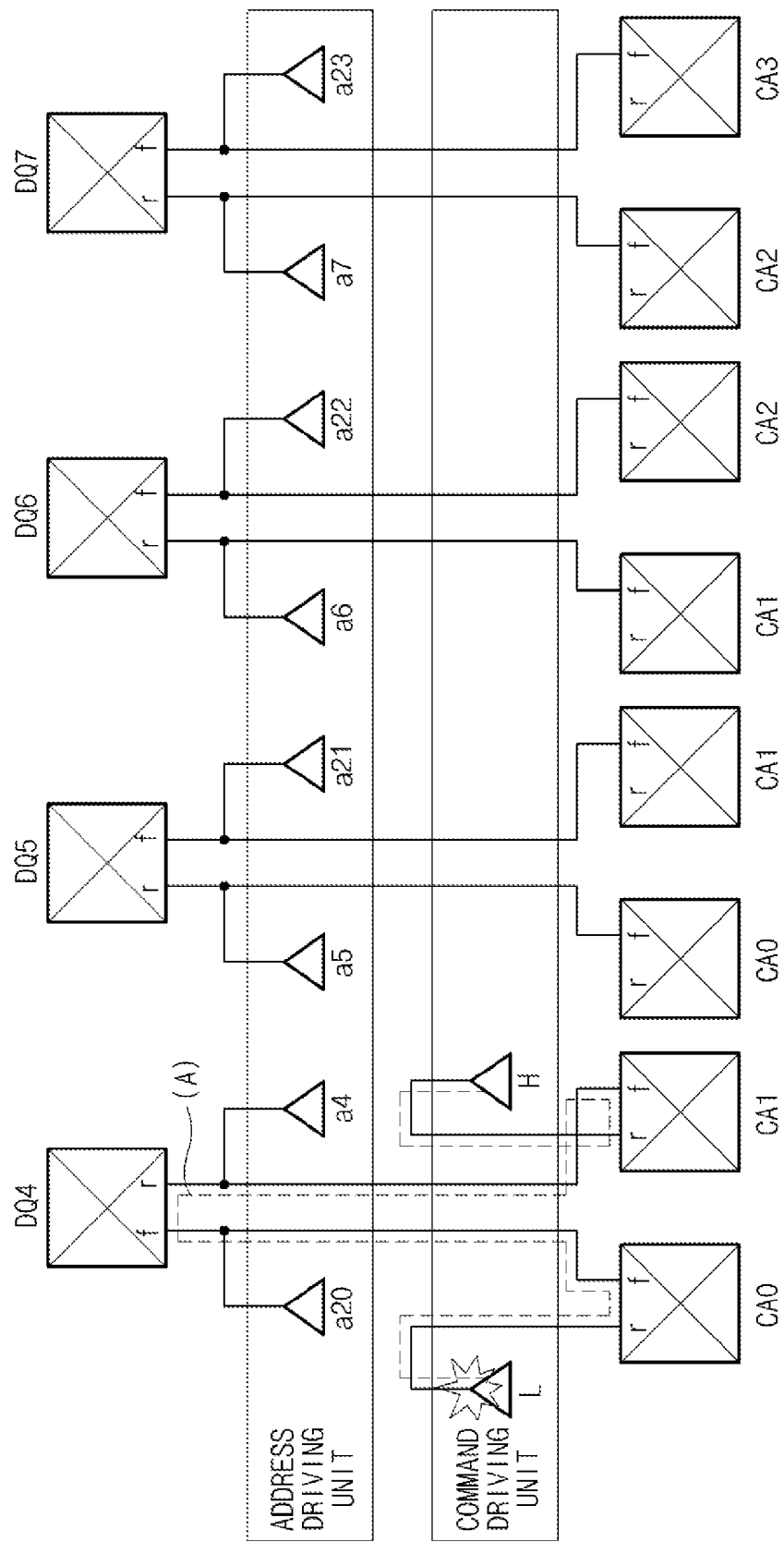
FIG. 5 illustrates problems of the conventional LPDDR nonvolatile memory device.
Figure 6:
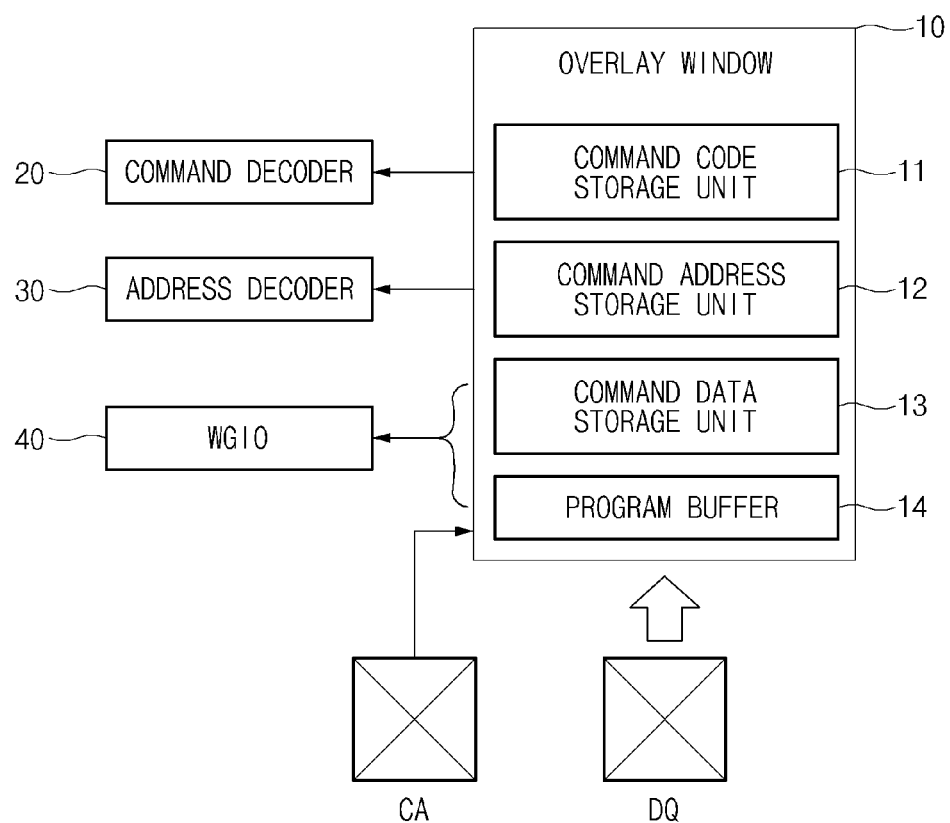
FIG. 6 illustrates a block diagram of the conventional LPDDR nonvolatile memory device.
Figure 7:
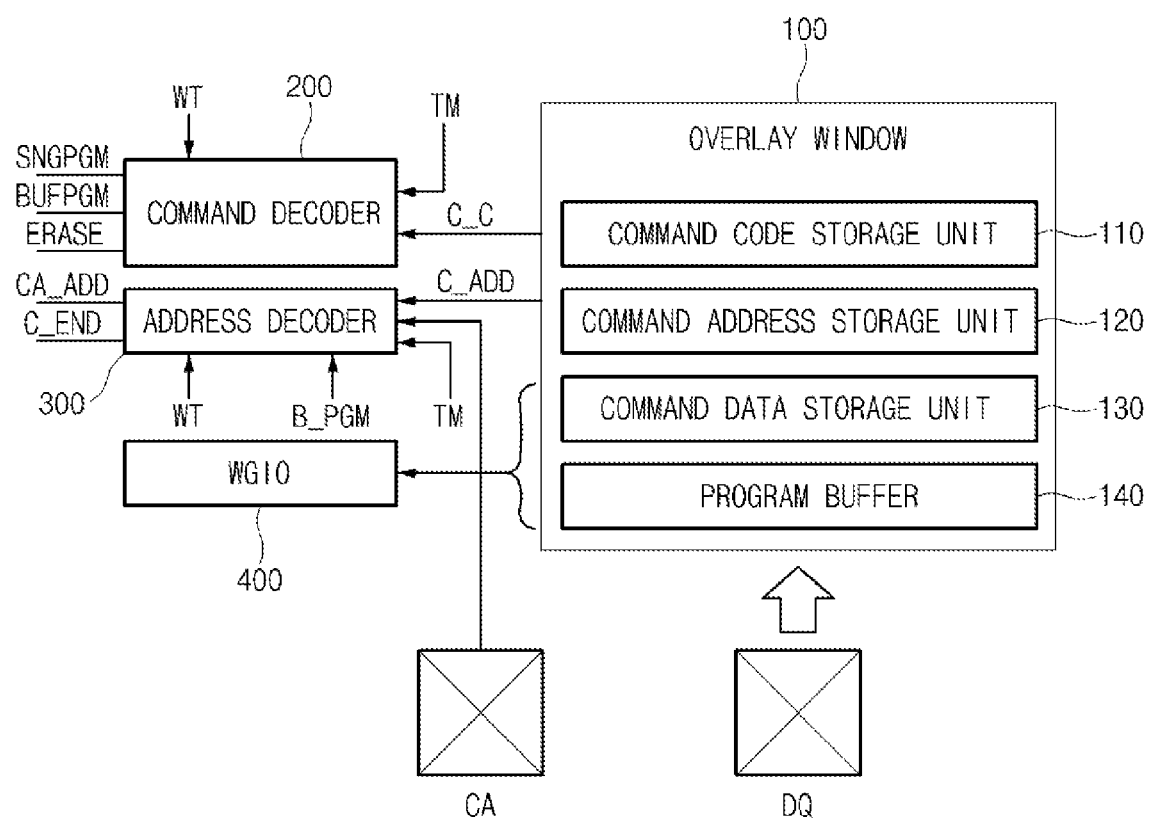
FIG. 7 illustrates a block diagram of a LPDDR nonvolatile memory device according to an embodiment of the present invention.

FIG. 7 illustrates a block diagram of a LPDDR nonvolatile memory device according to an embodiment of the present invention.

Referring to FIG. 7, the nonvolatile memory device includes an overlay window 100, a command decoder 200, an address decoder 300, and a global input output bus (WGIO) 400 configured to transmit write data.

The overlay window 100 includes a command code storage unit 110 configured to store a command code, a command address storage unit 120 configured to store a command address, a command data storage unit 130 configured to store command data, and a program buffer 140.

In a normal mode, a command code C_C stored in the command code storage unit 110 of the overlay window 100 is decoded by the command decoder 200 and transmitted into a memory (not shown). However, in accordance with an embodiment of the present invention, a test mode signal TM, and a write command WT are input to the command decoder 200. Thus, when the test mode signal TM is activated to enter a test mode, a program code is transmitted from the command decoder 200 directly into the memory without passing through the command code storage unit 110 of the overlay window 100.

The command decoder 200 converts the write command WT to a write code in response to the test mode signal TM to output a single program signal SNGPGM, a buffered program signal BUFPGM, or an erasure signal ERASE to the memory.

In the normal mode, a command address C_ADD stored in the command address storage unit 120 of the overlay window 100 is decoded by the address decoder 300 and transmitted to the memory.

In accordance with an embodiment of the present invention, the test mode signal TM and the write command WT are also input to the address decoder 300. Thus, when the test mode signal TM is activated to enter the test mode, a program address received from a CA pin (address pin) is transmitted from the address decoder 300 directly to the memory without passing through the command address storage unit 120 of the overlay window 100.

The address decoder 300 converts the address received from the CA pin to a command address in activation of the test mode signal TM and outputs a cell array address CA_ADD and a count end signal C_END to the memory in response to the write command WT. The address received from the CA pin in activation of the test mode signal TM is the cell array address CA_ADD.

Data inputted through a DQ pin (data pin) is stored in the command data storage unit 130 or the program buffer 140 in the overlay window 100. The command data stored in the command data storage unit 130 is transmitted to the memory through the global input output bus 400. Program information buffered by the program buffer 140 is transmitted to the memory through the global input output bus 400. The data received through the DQ pin becomes cell data.

Since the size of data used in a program operation may change depending on what a system desires, in accordance with an embodiment of the present invention, the command data storage unit 130 and the program buffer 140 in the overlay window 100 can be used even in the test mode. That is, due to a buffered operation and line connection, the command data storage unit 130 and the program buffer 140 in the overlay window 100 are used in the test mode. The command data storage unit 130 may include a register.

In accordance with an embodiment of the present invention, if a burst length is '16', 16 DQ pins may be used at most. When the buffered operation is performed, the program buffer 140 sets and outputs data with a 32-byte width. In the embodiment of the present invention, addresses used in the embedded operation are input to the address decoder 300 through CA pins using the test mode signal TM. In other words, the collision problem of command signals described with reference to the conventional nonvolatile memory device may be prevented by disconnecting an address driving unit from the DQ pin and coupling the address driving unit to only the CA pin in the test equipment.

In accordance with this embodiment of the present invention, in the test mode, an address of the address decoder 300 is designated by the address received through the CA pin. The DQ pin transmits data received from the outside into the overlay window 100. The data received through the DQ pin is stored in the command data storage unit 130 and the program buffer 140.

As a result, in the test mode, a command signal and an array address for the memory are determined based on values received from the command decoder 200 and the address decoder 300, and cell data for the memory is determined based on a value stored in the overlay window 100. Then, the embedded operation starts in activation of the write command WT.

Figure 8:
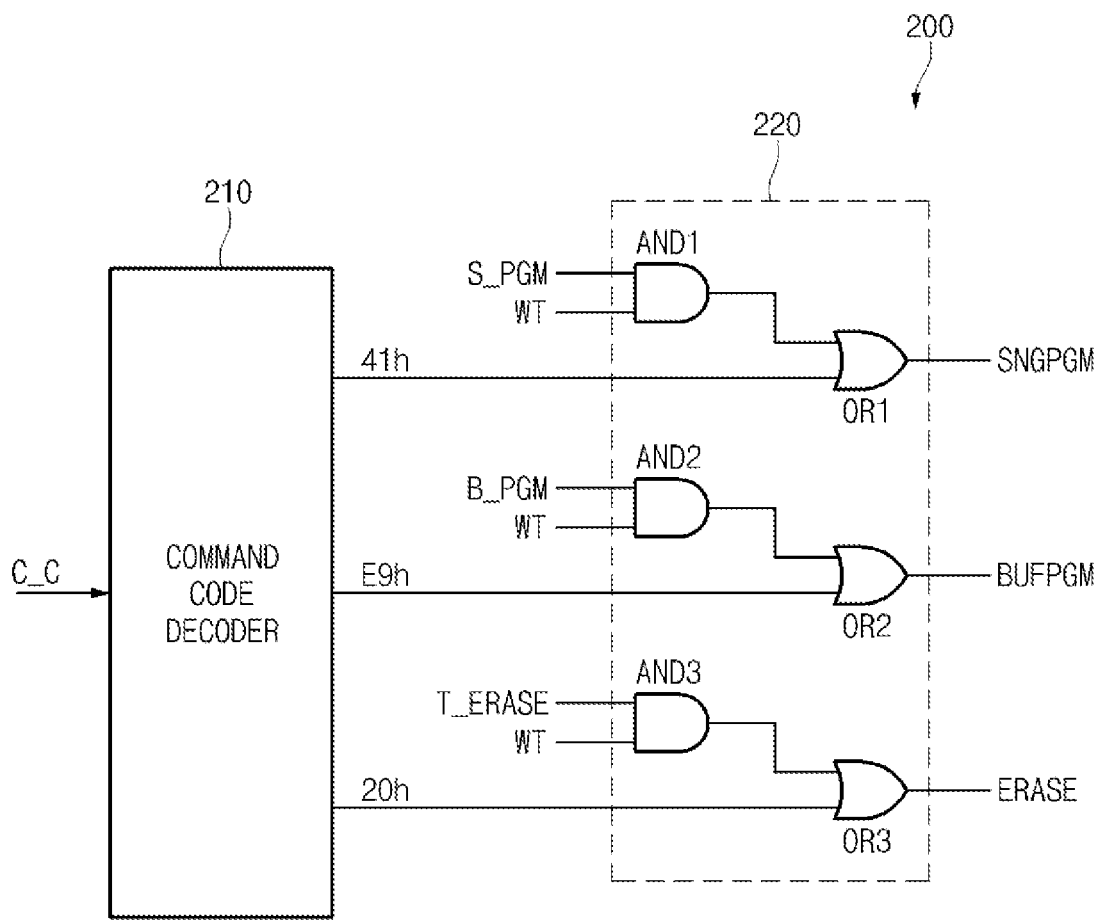
FIG. 8 illustrates a detailed diagram of a command decoder in FIG. 7.

FIG. 8 illustrates a detailed diagram of the command decoder 200 in FIG. 7.

The command decoder 200 includes a command code decoder 210 and a code combination unit 220. In the normal mode, the command code decoder 210 decodes the command code C_C received from the command code storage unit 110 to output a code signal 41$h$, E9$h$, or 20$h$. The code combination unit 220 includes a plurality of AND gates AND1~AND3 and a plurality of OR gates OR1~OR3.

The AND gate AND1 performs an AND operation on a single program test signal S_PGM and the write command WT. The OR gate OR1 performs an OR operation on the code signal 41$h$ and an output of the AND gate AND1 to output the single program signal SNGPGM.

The AND gate AND2 performs an AND operation on a buffered program test signal B_PGM and the write command WT. The OR gate OR2 performs an OR operation on the code signal E9$h$ and an output of the AND gate AND2 to output the buffered program signal BUFPGM.

The AND gate AND3 performs an AND operation on an erasure test signal T_ERASE and the write command WT. The OR gate OR3 performs an OR operation on the code signal 20$h$ and an output of the AND gate AND3 to output the erasure signal ERASE.

The test mode signal TM input to the command decoder 200 may include the single program test signal S_PGM, the buffered program test signal B_PGM, or the erasure test signal T_ERASE.

Figure 9:
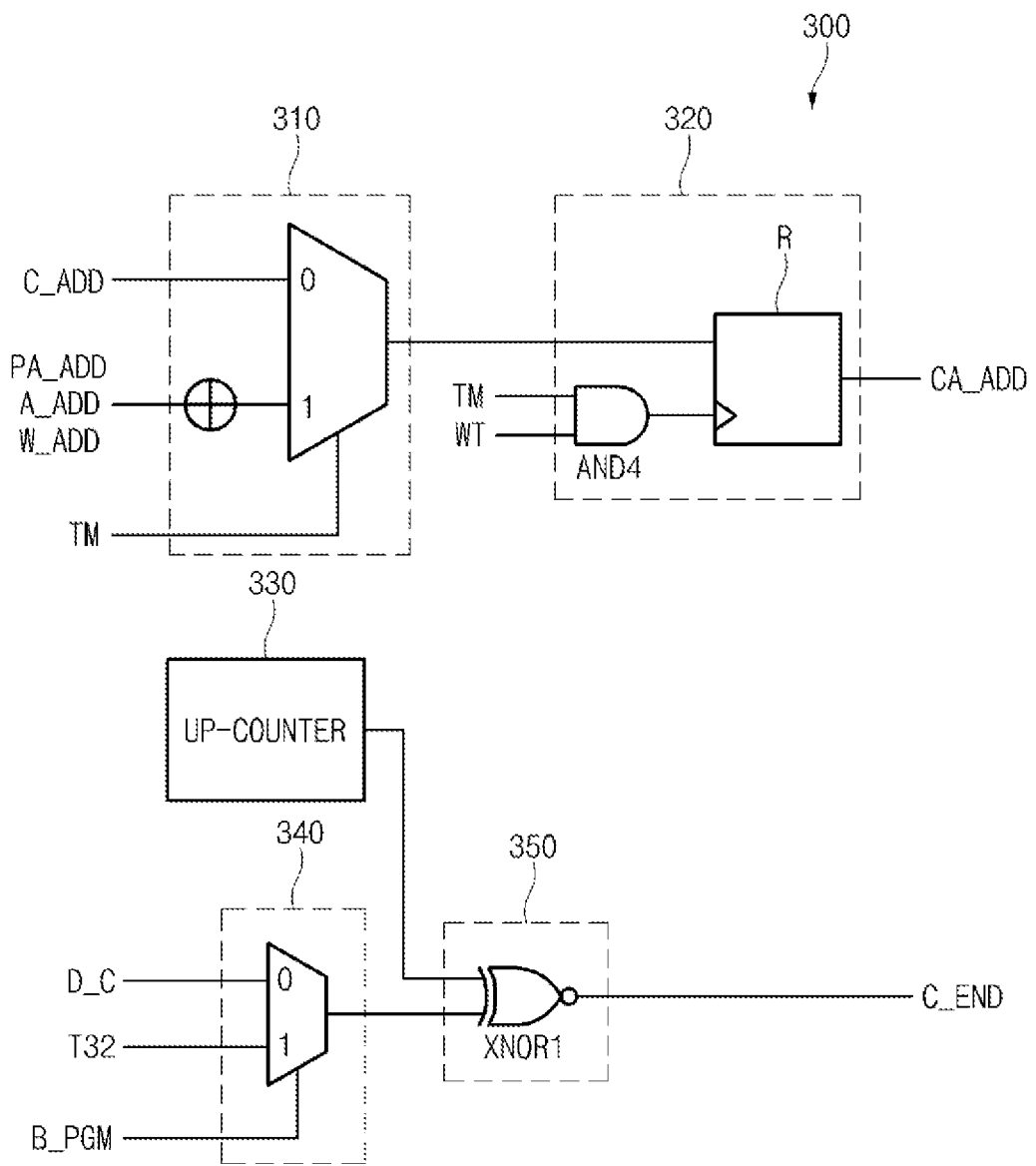
FIG. 9 illustrates a detailed diagram of an address decoder in FIG. 7.

FIG. 9 illustrates a detailed diagram of the address decoder 300 in FIG. 7.

The address decoder 300 includes an address selection unit 310, an address output unit 320, an up-counter 330, a data selection unit 340, and a data output unit 350.

The address selection unit 310 selects the command address C_ADD received from the command address storage unit 120 of the overlay window 100 or the address received through the CA pin in response to the test mode signal TM.

The address received through the CA pin includes a pre-active address PA_ADD, an active address A_ADD and a write address W_ADD. For example, when the test mode signal TM is at a high level, i.e., in the test mode, the pre-active address PA_ADD, the active address A_ADD and the write address W_ADD received through the CA pin are selected and outputted. The pre-active address PA_ADD, the active address A_ADD and the write address W_ADD are sequentially input through the CA pin. On the other hand, when the test mode signal TM is at a low level, i.e., in the normal mode, the command address C_ADD received from the command address storage unit 120 is selected and outputted. Thus, in accordance with an embodiment of the present invention, in the test mode, the address and data are transmitted to the memory using pre-active, active and write commands.

The address output unit 320 includes an AND gate AND4 and a latch R. The AND gate AND4 performs an AND operation on the test mode signal TM and the write command WT. When an output of the AND gate AND4 is activated to a high level, the latch R latches an output address of the address selection unit 310 to output the cell array address CA_ADD to the memory.

The up-counter 330 performs an up-counting operation to output a result value to the data output unit 350. For example, the up-counter 330 is initialized to '0' and then performs the up-count operation by increasing a count number from '0'.

The data selection unit 340 selects a data count D_C or a previously set data value T32 in response to the buffered program test signal B_PGM. The data count D_C is determined depending on how many bytes of data are written in the cells and represents the number of bytes of data transmitted to the program buffer 140. The previously set data value T32 represents that the data width is fixed at '32 bytes'.

For example, when the buffered program test signal B_PGM is at a high level, i.e., in the test mode, the previously set data value T32 is selected. On the other hand, when the buffered program test signal B_PGM is at a low level, i.e., in the normal mode, the data count D_C received from the program buffer 140 is selected.

The data output unit 350 includes an exclusive NOR gate XNOR1. The exclusive NOR gate XNOR1 performs an exclusive NOR operation on an output of the up-counter 330 and an output of the data selection unit 340 to output the count end signal C_END for notifying the operation end to the memory.

The following Table 1 shows input relationship of the command code, the command address and the command data in the test mode.

TABLE 1

| Test mode signal (TM) | Command code | Command address | Command data |
|---|---|---|---|
| S_PGM | No input from overlay window 100, SNGPGM output | Input through CA pin with pre-active, active and write commands | Stored in command data storage unit 130 through DQ pin, only 2 bytes of BL0 are valid data |
| B_PGM | No input from overlay window 100, BUFPGM output | Input through CA pin with pre-active, active and write commands | Stored in program buffer 140 through DQ pin, burst length fixed at '16' and data count fixed at '32' |
| T_ERASE | No input from overlay window 100, ERASE output | Input through CA pin with pre-active, active and write commands | No DQ data required, 1 block is operated at 128 Kbyte in the same way as in normal operation |

As shown in Table 1, when the test mode signal TM is input as the single program test signal S_PGM, the command code C_C is not input to the command decoder 200. The command decoder 200 outputs the single program signal SNGPGM. The command address is input through the CA pin with the pre-active, active and write commands. When the test mode indicates a single program, the command data is input through the DQ pin and stored in the command data storage unit 130 of the overlay window 100. Here, only 2 bytes of a bit line, e.g., BL0, is stored as valid data in the command data storage unit 130.

When the test mode signal TM is input as the buffered program test signal B_PGM, the command code C_C is not input to the command decoder 200. The command decoder 200 outputs the buffered program signal BUFPGM. The command address is input through the CA pin with the pre-active, active and write commands. When the test mode indicates a buffered program, the command data is input through the DQ pin and stored in the program buffer 140 of the overlay window 100. Here, the burst length is fixed at '16' and the data count value is fixed at '32'.

When the test mode signal TM is applied as the erasure test signal T_ERASE, the command code C_C is not input to the command decoder 200. The command decoder 200 outputs the erasure signal ERASE. The command address is input through the CA pin with the pre-active, active and write commands. In the erasure operation, no data is required. As a result, the erasure operation is performed on each block by 128 Kbyte in the same way as in the normal operation.

As mentioned above, the single program operation, the buffered program operation and the erasure operation, which are embedded operations, are performed differently from each other in the memory device. Thus, the test mode signal TM is classified depending on the single program operation, the buffered program operation, or the erasure operation, and is input to the command decoder 200 so that it is possible to omit a process of inputting command codes to the overlay window 100.

In a buffered program, the size of the cell data accessed by the system should be changeable. A data count representing the cell data size is stored in a register of the program buffer 140 in the overlay window 100.

However, when the test mode signal TM, i.e., the buffered program test signal B_PGM, is activated, the data count value used in the buffered program is fixed at '32' because the address and cell data information are transmitted through the CA pin and the DQ pin that can be used in the write command. Thus, there is no other way to transmit the data count. In an embodiment of the present invention, the size of the data count value is fixed at '32,' because, if the DQ width is x16, then the maximum burst length supported by the LPDDR nonvolatile memory device is '16'. If the DQ width is x8 or x32, the fixed data count value may be changed into 16 bytes or 64 bytes. However, in an embodiment of the present invention, the DQ width may not be limited to '16' and the data count value may be fixed to another value.

Figure 10:
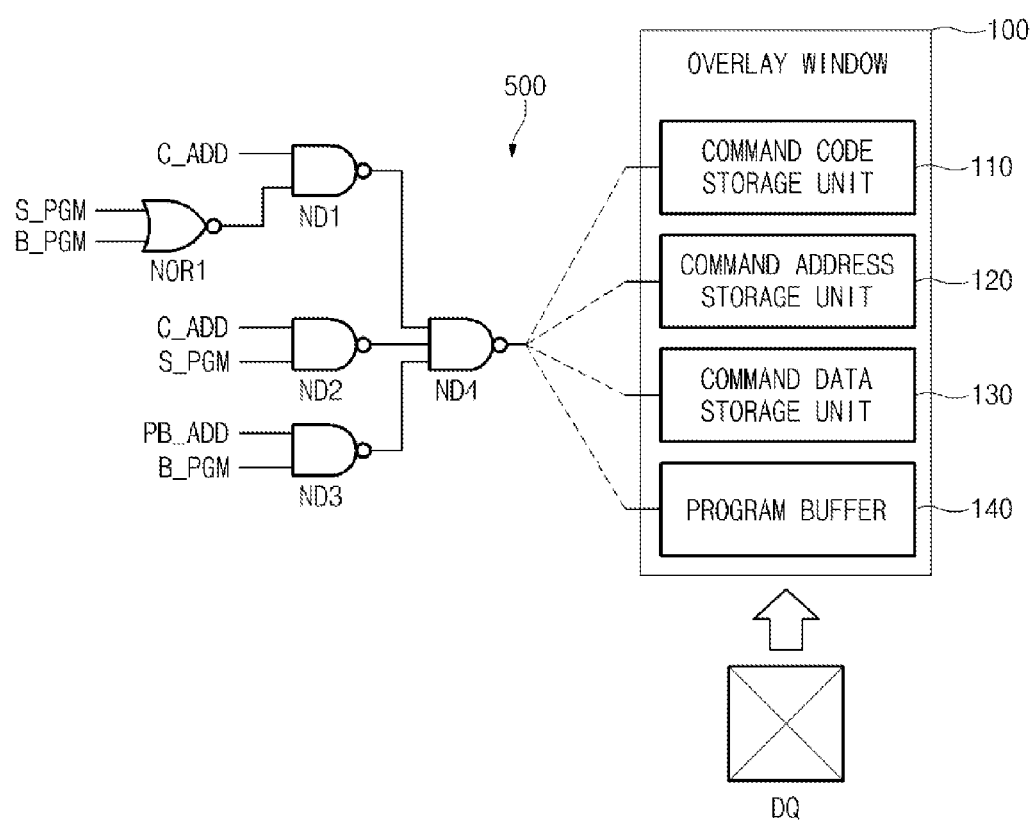
FIG. 10 illustrates a detailed diagram of a storage control unit according to an embodiment of the present invention.

FIG. 10 is a block diagram illustrating a storage control unit 500 for determining which register of the overlay window 100 the information input through the DQ pin is to be stored.

The command code storage unit 110, the command address storage unit 120, the command data storage unit 130 and the program buffer 140 included in the overlay window 100 may include registers for storing data.

The storage control unit 500 includes a NOR gate NOR1 and a plurality of NAND gates ND1~ND4. The NOR gate NOR1 performs a NOR operation on the single program test signal S_PGM and the buffered program test signal B_PGM. The NAND gate ND1 performs a NAND operation on an output of the NOR gate NOR1 and the command address C_ADD of the overlay window 100 input through the CA pin. The NAND gate ND2 performs a NAND operation on the command address C_ADD of the command data storage unit 120 and the single program test signal S_PGM. The NAND gate ND3 performs a NAND operation on an address PB_ADD of the program buffer 140 and the buffered program test signal B_PGM. The NAND gate ND4 performs a NAND operation on outputs of the NAND gates ND1~ND3 to store data in the overlay window 100.

In the normal mode, the information input through the CA pin is used as an address for designating a storage location in the overlay window 100. That is, data input through the DQ pin is stored in an appropriate location in the overlay window 100 in response to the information of the CA pin. However, in the test mode, the information input through the CA pin is used as the cell array address. Therefore, it is unknown whether the information input through the DQ pin is stored in the command data storage unit 130 or the program buffer 140. However, this can be determined based on a test mode code. That is, when the test mode signal TM is activated to the single program test signal S_PGM, the information input through the CA pin is ignored, and the data input through the DQ pin is stored in the command data storage unit 130. When the test mode signal TM is activated to the buffered program test signal B_PGM, the information input through the CA pin is ignored, and the data input through the DQ pin is stored in the program buffer 140.

In accordance with an embodiment of the present invention, it is possible to reduce a test time because information such as the command code, address and data, which are separately input to the overlay window 100 in response to several write commands in the conventional nonvolatile memory device, is input to the memory in response to one write command.

For example, if the buffered program operation is performed through the LPDDR nonvolatile memory, a time t0W for writing data in the overlay window 100 and a write time tPGM for programming the data in the cells are required in the program operation. Here, the time t0W is (tRP+tRCD+tWR) x1, wherein tRP represents a RAS precharge time, tRCD represents a RAS to CAS delay, and tWR represents a write recovery time.

In a DDR using eight clocks, the condition for writing data in the overlay window 100 sets a burst length to '16', tRP to 3xtCK, tRCD to 100 nsec and tWR to write latency (WL)+BL/2. That is, in the buffered program operation, all of the above information is required to perform the embedded operation. Then, the system transmits the information to the memory using the write command. As a result, since more information is required in the program operation, the write operation time becomes longer. Moreover, when the information is dispersed in the overlay window 100, the pre-active operation and the active operation are required.

In order to perform the buffered program operation, the required information should be transmitted using a command code, an address, a program buffer, a multi-purpose register and a write command. For this buffered program operation, the number of pre-active and active operations required in an embodiment of the present invention is '1'. That is, in the buffered program operation, only one write operation is necessary for the overlay window 100. In this case, the burst length is fixed at '16' so that the previously set value T32 operates as '32'. Thus, an embodiment of the present invention can reduce the test time by decreasing the write time for the overlay window 100.

Figure 11:
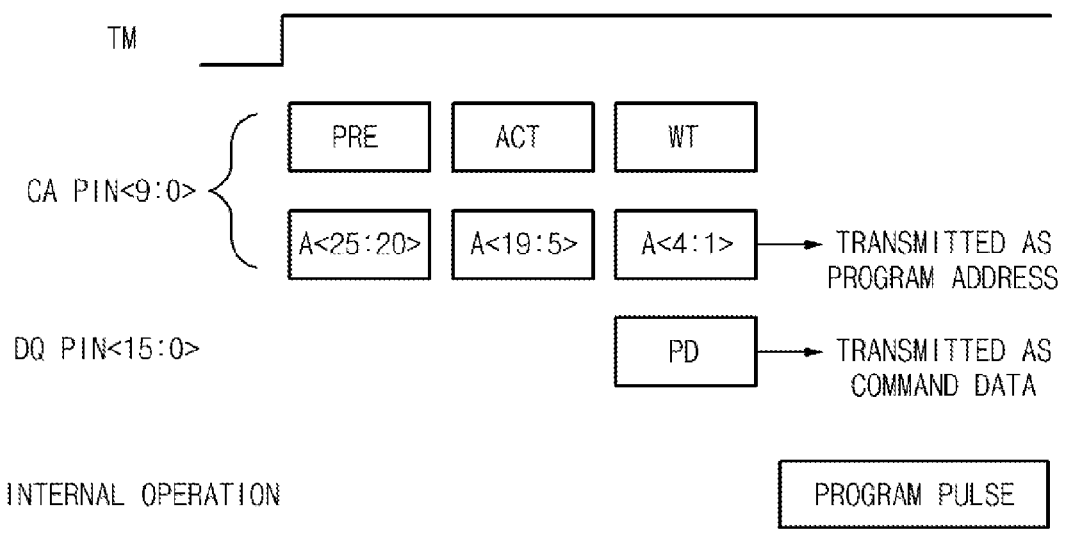
FIG. 11 illustrates an operation of a nonvolatile memory device according to an embodiment of the present invention.

FIG. 11 illustrates an operation of a nonvolatile memory device according to an embodiment of the present invention.

When the test mode signal TM is activated to the high level, the address input through the CA pin is transmitted as the program address to perform the pre-active, active and write operations. The program data received through the DQ pin is transmitted as the command data. As a result, a program pulse for performing the program operation is generated in the memory.

Figure 12:
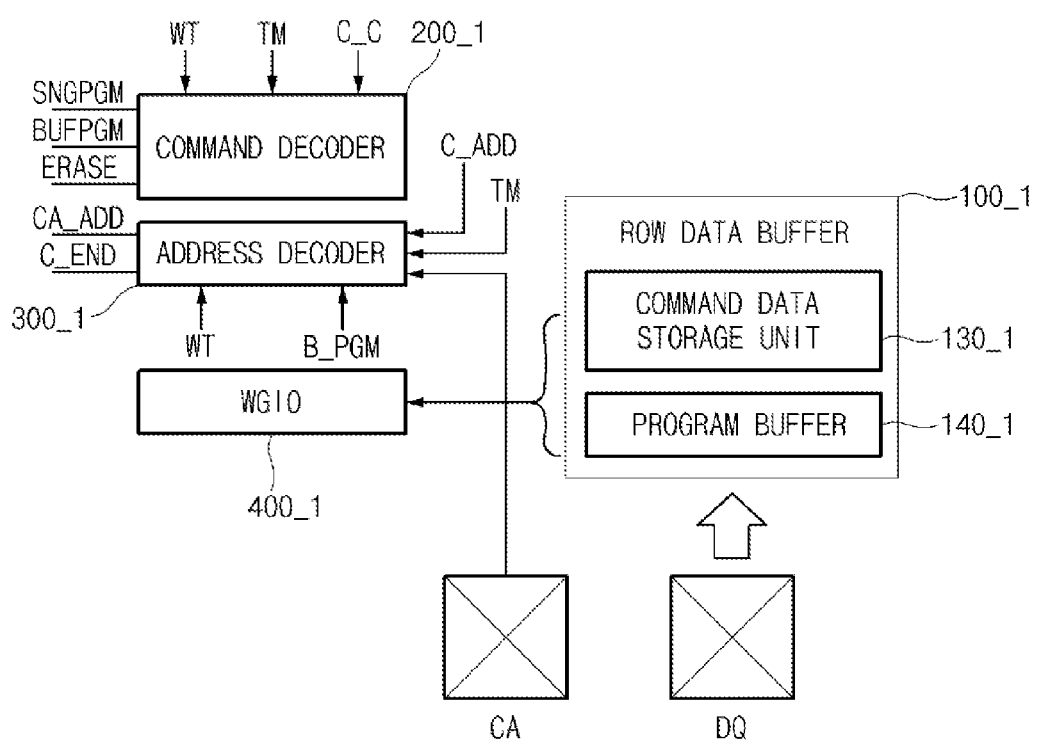
FIG. 12 illustrates a block diagram of a LPDDR nonvolatile memory device according to another embodiment of the present invention.

FIG. 12 illustrates a block diagram of a nonvolatile memory device according to another embodiment of the present invention.

Referring to FIG. 12, the nonvolatile memory device includes a row data buffer 100_1, a command decoder 200_, an address decoder 300_1 and a global input output bus (WGIO) 400_1 configured to transmit write data.

The row data buffer 100_1 includes a command data storage unit 130_1 configured to store command data and a program buffer 140_1. The row data buffer 100_1 stores the command data in the command data storage unit 130_1, and the program buffer data is stored in the program buffer 140_1. The row data buffer 100_1 is implemented using a buffer defined in the specifications of the JEDEC for the LPDDR nonvolatile memory device.

A command code C_C is decoded by the command decoder 200_1 in a normal mode and transmitted to a memory (not shown). The command code C_C may be stored in a command code storage unit of an overlay window (not shown). However, in this embodiment of the present invention, a test mode signal TM and a write command WT are input to the command decoder 200_1. Therefore, when the test mode signal TM is activated to enter a test mode, a program code is transmitted from the command decoder 200_1 directly to the memory without passing through the command code storage unit of the overlay window.

The command decoder 200_1 converts the write command WT to a write code in activation of the test mode signal TM to output a single program signal SNGPGM, a buffered program signal BUFPGM, or an erasure signal ERASE to the memory.

A command address C_ADD stored in the command address storage unit of the overlay window is decoded by the address decoder 300_1 in the normal mode and transmitted to the memory.

However, in this embodiment of the present invention, the test mode signal TM and the write command WT are input to the address decoder 300_1. Thus, when the test mode signal TM is activated to enter the test mode, a program address received from a CA pin (address pin) is transmitted from the address decoder 300_1 directly to the memory without passing through the command address storage unit of the overlay window.

The address decoder 300_1 converts the address received from the CA pin to a command address in activation of the test mode signal TM and outputs a cell array address CA_ADD and a count end signal C_END to the memory in response to the write command WT. The address received from the CA pin when the test mode signal TM is activated becomes the cell array address CA_ADD.

The configuration of the command decoder 200_1 and the address decoder 300_1 is substantially the same as that of FIGS. 8 and 9. FIG. 12 illustrates an embodiment of the present invention in which the command code C_C and the command address C_ADD are received from the overlay window.

Also, data input through a DQ pin (data pin) is stored in the command data storage unit 130_1 or the program buffer 140_1 in the row data buffer 100_1.

The command data stored in the command data storage unit 130_1 of the row data buffer 100_1 is transmitted to the memory through the global input output bus 400_1. The program information buffered by the program buffer 140_1 of the row data buffer 100_1 is transmitted to the memory through the global input output bus 400_1. The data received through the DQ pin is a cell data.

Since the size of data used in a program operation may change depending on what the system desires, in accordance with another embodiment of the present invention, the command data storage unit 130_1 and the program buffer 140_1 in the row data buffer 100_1 are used in the test mode. That is, due to a buffered operation and line connection, the command data storage unit 130_1 and the program buffer 140_1 in the row data buffer 100_1 are used in the test mode. The command data storage unit 130_1 may include a register.

In accordance with another embodiment of the present invention, if a burst length is '16, 16 DQ pins may be used at most. When the buffered operation is performed, the program buffer 140_1 sets and outputs data with a 32 byte width. In an embodiment of the present invention, addresses used in the embedded operation are input to the address decoder 300_1 through CA pins using the test mode signal TM. In other words, the collision problem of command signals described with reference to the conventional nonvolatile memory device may be prevented by disconnecting an address driving unit from the DQ pin and coupling the address driving unit to only the CA pin in the test equipment.

In accordance with this embodiment of the present invention, in the test mode, an address of the address decoder 300_1 is designated by the address received through the CA pin. The DQ pin transmits data received from the outside into the row data buffer 100_1. The data received through the DQ pin is stored in the command data storage unit 130_1 and the program buffer 140_1.

As a result, in the test mode, a command signal and an array address for the memory are determined based on values received from the command decoder 200_1 and the address decoder 300_1, and cell data for the memory is determined based on a value stored in the row data buffer 100_1. Then, the embedded operation starts in activation of the write command WT.

As described above, the nonvolatile memory device according to an embodiment of the present invention provides the following benefits.

First, since the address information is transmitted through the CA pin, the conventional test equipment used for other memories can be used for the LPDDR nonvolatile memory device.

Second, since the information required for the embedded operation is transmitted to the memory through the command decoder and the address decoder without transmitting the information to the overlay window, the test time can be reduced.

Although a number of illustrative embodiments consistent with the present invention have been described, it should be understood that numerous other modifications and embodiments can be devised by those skilled in the art that will fall within the spirit and scope of the principles of this disclosure. Particularly, numerous variations and modifications are possible in the component parts and/or arrangements which are within the scope of the disclosure, the drawings and the accompanying claims. In addition to variations and modifications in the component parts and/or arrangements, alternative uses will also be apparent to those skilled in the art.

What is claimed is:

1. A nonvolatile memory device, comprising:
a command decoder configured to decode a test mode signal input through an address pin in a test mode to output a program signal or an erasure signal to a memory;
an address decoder configured to decode a command address input through the address pin in the test mode to output a cell array address to the memory; and
an overlay window configured to store data input through a data pin in the test mode.

2. The nonvolatile memory device according to claim 1, wherein the program signal includes a single program signal or a buffered program signal.

3. The nonvolatile memory device according to claim 1, wherein the overlay window comprises:
a command data storage unit configured to store command data received through the data pin in the test mode; and
a program buffer configured to buffer data received through the data pin in the test mode and store the buffered data.

4. The nonvolatile memory device according to claim 3, wherein the command data is stored in the command data storage unit when the test mode signal is a single program test signal.

5. The nonvolatile memory device according to claim 3, wherein the data received through the data pin is stored in the program buffer when the test mode signal is a buffered program test signal.

6. The nonvolatile memory device according to claim 1, wherein, in the test mode, a command signal and the cell array address for the memory are determined based on a signal from the command decoder and the address decoder, and cell data of the memory is determined based on the data stored in the overlay window.

7. The nonvolatile memory device according to claim 1, wherein the command decoder comprises:
a command code decoding unit configured to decode a command code stored in the overlay window in a normal mode; and
a code combination unit configured to combine the test mode signal, a write command, and an output of the command code decoding unit in the test mode.

8. The nonvolatile memory device according to claim 7, wherein the code combination unit is configured to activate the program signal or the erasure signal when the test mode signal and the write command are activated in the test mode.

9. The nonvolatile memory device according to claim 7, wherein the test mode signal includes a single program test signal, a buffered program test signal, or an erasure test signal.

10. The nonvolatile memory device according to claim 1, wherein the address decoder comprises:
an address selection unit configured to select the command address or an address stored in the overlay window in response to the test mode signal; and
an address output unit configured to latch an output of the address selection unit to output the cell array address when the test mode signal and a write command are activated.

11. The nonvolatile memory device according to claim 10, wherein the command address includes a pre-active address, an active address, and a write address.

12. The nonvolatile memory device according to claim 11, wherein the pre-active address, the active address, and the write address are sequentially applied to the address decoder.

13. The nonvolatile memory device according to claim 10, wherein the address output unit comprises:
a logic combination element configured to combine the write command with the test mode signal; and
a latch element configured to latch the output of the address selection unit in response to an output of the logic combination element.

14. The nonvolatile memory device according to claim 10, wherein the address decoder further comprises:
an up-counter configured to perform an up counting operation;
a data selection unit configured to select a previously set data count value or a data count value stored in the overlay window in response to the test mode signal, wherein the test mode signal is a buffered program test signal; and
a logic combination element configured to combine an output of the data selection unit with an output of the up-counter to output a count end signal.

15. The nonvolatile memory device according to claim 1, further comprising a global input output bus configured to transmit the data stored in the overlay window to the memory.

16. The nonvolatile memory device according to claim 1, wherein the overlay window further comprises:
a command code storage unit configured to store a command code in a normal mode; and a command address storage unit configured to store a command address in the normal mode.

17. The nonvolatile memory device according to claim 1, wherein the overlay window outputs the stored data with a width of 32 bytes when a burst length is 16 in a buffered program operation.

18. The nonvolatile memory device according to claim 1, further comprising a storage control unit configured to store information received through the data pin in the overlay window.

19. The nonvolatile memory device according to claim 18, wherein the storage control unit is configured to use information input through the address pin as an address of the overlay window in a normal mode.

20. The nonvolatile memory device according to claim 19, wherein the storage control unit is configured to store data input through the data pin in a command data storage unit or a program buffer of the overlay window in the test mode.

21. The nonvolatile memory device according to claim 20, wherein the storage control unit stores the data in the command data storage unit when the test mode signal is a single program test signal and in the program buffer when the test mode signal is a buffered program test signal.

22. A nonvolatile memory device, comprising:
a command decoder configured to decode a test mode signal input through an address pin in a test mode to output a program signal or an erasure signal to a memory;
an address decoder configured to decode a command address input through the address pin in the test mode to output a cell array address to the memory; and
a row data buffer configured to store data input through a data pin in the test mode.

23. The nonvolatile memory device according to claim 22, wherein the program signal includes a single program signal or a buffered program signal.

24. The nonvolatile memory device according to claim 22, wherein the row data buffer comprises:
a command data storage unit configured to store command data received through the data pin in the test mode; and
a program buffer configured to buffer data received through the data pin in the test mode and store the buffered data.

25. The nonvolatile memory device according to claim 24, wherein the command data is stored in the command data storage unit when the test mode signal is a single program test signal.

26. The nonvolatile memory device according to claim 24, wherein the data received through the data pin is stored in the program buffer when the test mode signal is a buffered program test signal.

27. The nonvolatile memory device according to claim 22, wherein, in the test mode, a command signal and the cell array address for the memory are determined based on signals applied from the command decoder and the address decoder, and cell data of the memory determined based on the data stored in the row data buffer.

28. The nonvolatile memory device according to claim 22, wherein the command decoder comprises:
a command code decoding unit configured to decode a command code stored in an overlay window in a normal mode; and
a code combination unit configured to combine the test mode signal, a write command, and an output of the command code decoding unit in the test mode.

29. The nonvolatile memory device according to claim 28, wherein the code combination unit is configured to activate the program signal or the erasure signal when the test mode signal and the write command are activated in the test mode.

30. The nonvolatile memory device according to claim 28, wherein the test mode signal includes a single program test signal, a buffered program test signal, or an erasure test signal.

31. The nonvolatile memory device according to claim 22, wherein the address decoder comprises:
an address selection unit configured to select the command address or an address stored in an overlay window in response to the test mode signal; and
an address output unit configured to latch an output of the address selection unit to output the cell array address when the test mode signal and a write command are activated.

32. The nonvolatile memory device according to claim 31, wherein the command address includes a pre-active address, an active address, and a write address.

33. The nonvolatile memory device according to claim 32, wherein the pre-active address, the active address, and the write address are sequentially applied to the address decoder.

34. The nonvolatile memory device according to claim 31, wherein the address output unit comprises:
a logic combination element configured to combine the write command with the test mode signal; and
a latch element configured to latch the output of the address selection unit in response to an output of the logic combination element.

35. The nonvolatile memory device according to claim 31, wherein the address decoder further comprises:
an up-counter configured to perform an up counting operation;
a data selection unit configured to select a previously set data count value or a data count value stored in the overlay window in response to the test mode signal, wherein the test mode signal is a buffered program test signal; and
a logic combination element configured to combine an output of the data selection unit with an output of the up-counter to output a count end signal.

36. The nonvolatile memory device according to claim 22, further comprising a global input output bus configured to transmit the data stored in the row data buffer to the memory.

37. The nonvolatile memory device according to claim 22, wherein the row data buffer outputs the stored data with a width of 32 bytes when a burst length is 16 in a buffered program operation.

* * * * *